(12) United States Patent
Choi et al.

(10) Patent No.: US 6,910,170 B2
(45) Date of Patent: Jun. 21, 2005

(54) PRE-DECODER FOR A TURBO DECODER, FOR RECOVERING PUNCTURED PARITY SYMBOLS, AND A METHOD FOR RECOVERING A TURBO CODE

(75) Inventors: Goang-seog Choi, Kyungki-do (KR); Soo-won Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 640 days.

(21) Appl. No.: 09/939,604

(22) Filed: Aug. 28, 2001

(65) Prior Publication Data

US 2002/0091973 A1 Jul. 11, 2002

(30) Foreign Application Priority Data

Jan. 8, 2001 (KR) ............................................. 2001-962

(51) Int. Cl.[7] ........................ H03M 13/29; H03M 13/35
(52) U.S. Cl. ...................................... 714/755; 714/790
(58) Field of Search ................................ 714/755, 790, 714/789

(56) References Cited

U.S. PATENT DOCUMENTS

| | | | | |
|---|---|---|---|---|
| 6,307,901 B1 | * | 10/2001 | Yu et al. ...................... | 375/341 |
| 6,487,693 B1 | * | 11/2002 | Kim et al. ................... | 714/786 |
| 6,606,724 B1 | * | 8/2003 | Krieger et al. .............. | 714/755 |
| 6,628,723 B1 | * | 9/2003 | Gerlach et al. ............. | 375/259 |
| 6,728,323 B1 | * | 4/2004 | Chen et al. ................. | 375/340 |

OTHER PUBLICATIONS

Lin et al., "Low Power Soft Output Viterbi Decoder Scheme for Turbo Code Decoding", 1997 IEEE International Symposium on Circuits and Systems, Jun. 9–12, 1997, pp. 1369–1372.*

Halter S et al: "Reconfigurable signal processor for channel coding & decoding in low snr wireless communications" IEEE Workshop on Signal Processing Systems. SIPS. Design and Implementation, XX, XX, Oct. 8, 1998, pp. 260–274, XP002124485 * figure 2 *.

* cited by examiner

*Primary Examiner*—Stephen M. Baker
(74) *Attorney, Agent, or Firm*—Sughrue Mion, PLLC

(57) ABSTRACT

A pre-decoder applied to a turbo decoder for decoding a punctured turbo code. The turbo code consists of a data bit stream and a plurality of parity bit streams, parts of which are punctured. The pre-decoder has an arithmetic unit for calculating estimated parity bit streams by carrying out, with respect to the data bit stream, the same algorithm used by a turbo encoder to produce the parity bit streams, a comparison unit for comparing the plurality of parity bit streams with the estimated parity bit streams, and a recovery unit for substituting estimated parity symbols for corresponding punctured parts of the parity symbol streams when related non-punctured bits of the parity bit streams are identical with corresponding estimated non-punctured parity bits. The punctured parity symbols are recovered by the pre-decoder completely, or at least partially, and provided to the turbo decoder. Accordingly, the decoding performance of the turbo decoder is enhanced.

7 Claims, 5 Drawing Sheets

PRE-DECODER FOR A TURBO DECODER, FOR RECOVERING PUNCTURED PARITY SYMBOLS, AND A METHOD FOR RECOVERING A TURBO CODE

BACKGROUND OF THE INVENTION

1. Field of the Invention

The present invention relates to a pre-decoder applied to a turbo decoder, and more particularly to a pre-decoder for recovering punctured portions of turbo codes transferred with punctured parity bits and providing the recovered turbo codes to the turbo decoder.

2. Description of the Related Art

In general, in wireless digital communications, methods are employed for adding error-correction codes at a transmitter and correcting errors at a decoder in order to correct errors on channels. The Turbo code is used as one of the error-correctable coding methods. The Turbo code has been chosen in the United States-bound CDMA2000 and the Europe-bound W-CDMA for channels which require high data rates. It is known that the Turbo code nearly approaches the Shannon Limit which is the theoretical limit value by performing iterative decoding even at low signal-reception power. There are the Soft-Output Viterbi Algorithm (SOVA) method and the Maximum A Posteriori (MAP) method for the decoding method of the Turbo code, and it is known that the MAP method has an about 0.38 dB higher coding gain in the Additive White Gausian Noise (AWGN) environment having a better channel environment, and an about 3 dB higher coding gain in the Rayleigh Fading environment having a worse channel environment, than the SOVA method has. Further, even encoding is carried out at the code rate R=½ with puncturing in the state of the code rate R=⅓.

FIG. 1 is a view for showing a turbo encoder for generating turbo codes, which has the code rate R=⅓. The turbo encoder is constituted with two parallel-concatenated recursive systematic convolutional (RSC) blocks RSC1 and RSC2 and an interleaver. An information bit sequence $d_k$ is input to the first RSC block RSC1, and the RSC block RSC1 generates a first parity bit stream $Y_{1k}$. At the same time, the information bit sequence $d_k$ is input to the interleaver and then stored by frame unit. The information bit sequence $d_k$ input to the interleaver is interleaved by the interleaver, and the interleaved information bit sequence $d_k'$ is input to the second RSC block RSC2. The RSC block RSC2 generates a second parity bit stream $Y_{2k}$.

$X_k$, information bit stream $d_k$, which is input as it is, is attached to the first and second bit streams $Y_{1k}$ and $Y_{2k}$, so a turbo code of which symbol sequence $X_1, Y_{11}, Y_{21}, X_2, Y_{22}, X_3, Y_{13}, Y_{23}, \ldots$ is generated and, in this situation, the code rate becomes R=⅓. Here, generally, the parity bit $Y_k$ get punctured to enhance the transmission efficiency, and, like the general cases, if puncturing is made to be R=½ according to a method of alternately puncturing respective streams of the parity bits, the symbol sequence becomes like $X_1, Y_{11}, X_2, Y_{22}, \ldots, X_{N-1}, Y_{1N-1}, X_N, Y_{2N}$ (here, N is an even number). The symbol sequence is modulated with the binary phase shift keying (BPSK) to be transferred to channels. Namely, the symbol sequence of 1 and 0 are changed to the transfer symbols of +1 and −1 to be transmitted to channels.

Various noises are added to the transfer symbols received through the channels, which can be expressed in mathematical formulas as below:

$$x_k=(2X_k-1)+P_k$$

$$y_k=(2Y_k-1)+Q_k$$

Here, $X_k$ and $X_k$ are transferred data bit stream and received data symbol stream respectively, and $Y_k$ and $y_k$ are transferred parity bit streams and received parity symbol streams respectively, and $P_k$ and $Q_k$ are noises independent from each other.

A general block diagram of the Turbo decoder using the MAP method, as shown in FIG. 2, can be shown as a form of two serial-concatenated decoders Dec1 and Dec2. The principle of such Turbo decoder is described as follows.

A received symbol sequence of a frame is $R^N_1$ is expressed by, $$R^N_1=(R_1, \ldots, R_k, \ldots, R_N)$$

Here, $R^N_1=(X_k, y_k)$, which are received symbols at time k.

A likelihood ratio $\lambda_k$ related to the $R^N_1$ to be decoded is defined by, $$\lambda_k=P(d_k=1|R^N_1)/(P(d_k=0|R^N_1)$$

Here, i=0,1, and $P(d_k=i|R^N_1)$ is an A Posteriori Probability (APP) of the information bit $d_k$. The MAP method is a method for selecting the information bit $d_k$ in order for the APP to be maximized.

The first decoder Dec1 generates extrinsic information of the information bit $d_k$ with an A Priori Ratio $L_a(d_k)$ of the information bit $d_k$, a value $L(x_k)$ for a received information symbol, and a value $L(y_{1k})$ for a received symbol of a parity by the first encoder RSC1. The $L_a(d_k)$ of the first decoder Dec1 becomes 0 at the first iteration, which is because log 1=0 when calculated in the log domain, since the value of $d_k$ is constituted with 1 and 0 and the Priori Probability of 1 and the Priori Probability of 0 can be equally assumed as ½, and the value(½)/(½) equals 1. The $L(x_k)$ and $L(y_k)$ become values obtained from multiplying the values of $x_k$ and $y_{1k}$ by a channel reliability $L_c$. With such input values, an output $L_1(d_k)$ of the first decoder Dec1 consists of a combination of terms shown in the following formula:

$$L_1(d_k)=L_a(d_k)+L(x_k)+L_{e1}(d_k),$$

wherein the terms of $L_a(d_k)$ and $L(x_k)$ are the terms received as inputs, and, if these terms are eliminated from an output, an extrinsic information produced by the first decoder Dec1 becomes $L_{e1}(d_k)$. These terms are related to each $d_k$ and utilized as the A Priori Ratio of information bits in the second decoder Dec2.

Viewing an input of the second decoder Dec2 during the first iteration, the A Priori Ratio $L_a(d_k)$ of the information bit $(d_k)$ becomes the $L_{e1}(d_k)$ obtained from the first decoder Dec1, and the value $L(x_k)$ for a received information symbol and the value $L(y_{2k})$ for a received symbol of a parity by the second RSC block RSC2 are input to the second decoder Dec2. Here, since the received parity symbol is a value obtained in an interleaved state at the transmitter, the information symbol value $L(x_k)$ and the extrinsic information $L_{e1}(d_k)$ of the first decoder Dec1 used for an A Priori Ratio value are inputted after interleaving. An output $L_2(d_k)$ of the second decoder Dec2 is formed with a combination of terms as shown in a following formula. Namely, $$L_2(d_k)=L_a(d_k)(=L_{e1}(d_k))+L(x_k')+L_{e2}(d_k),$$

wherein $L_{e2}(d_k)$ is an extrinsic information which the second decoder Dec2 produces and is utilized for the A Priori Probability Ratio value of the first decoder Dec1 in the second iteration.

A parity symbol and information transmitted from the transmitter are modulated to +1 and −1 and then transferred. If no noise exists on a channel, +1 is received as +1 and −1 as −1, although such actually does not happen because of the presence of noise on the channel. In case of the existence of a little noise, receptions are made off +1 by the noise influence such as +0.9, +1.1, +0.8, +1.2, and so on, and the same applies to −1. Further, values obtained from multiplying such received symbol values by the channel reliability $L_c$ are input to the Turbo decoder. In case that a channel is the Additive White Gausian Noise (AWGN) channel, $L_c$ becomes $2/\sigma^2$ and is multiplied by the received symbols. As for the first decoder Dec1, inputted $L(x_k)$ and $L(y_k)$ are produced by multiplying respective received symbols $x_k$ and $y_k$ by $L_c$.

An extrinsic information of an information bit of the k-th time in the first decoder Dec1 is as follows:

$$L_{e1}(d_k) = \text{Log}(\Sigma \alpha_{k-1}(s)\gamma_k(d_k=1)\beta_k(s')/\Sigma \alpha_{k-1}(s')\gamma_k(d_k=)\beta_k(s')),$$

wherein $\alpha_{k-1}(s)$ is a feedforward state metric at time k−1 and in the state s, $\beta_k(s')$ is a feedback state metric at time k in the state s', $\gamma_k(d_k=1)$ is a branch metric at time k of which estimation value of information bits is $1(d_k=1)$, and $\gamma_k(d_k=0)$ is a branch metric at time k of which estimation value of the information bits is $0(d_k=0)$. $\alpha_{k-1}(s)$ is calculated by using the received symbols $L(x_k)$ and $L(y_{1k})$ at $\alpha_0(s)$ at time t=0, such as $\alpha_0(s)$, $\alpha_2(s)$, ..., and $\beta_k(s')$ is calculated by using the received symbols $L(x_k)$ and $L(y_{1k})$ at $\beta_n(s')$ at time t=N, such as $\beta_{N-1}(s')$, $\beta_{N-2}(s')$, .... That is, it is meant that the k-th received symbols are used for the update of $\alpha_{k-1}(s)$ and $\beta_k(s')$. After all, the turbo decoding of using the iterative MAP method can be referred to as a job of improving the extrinsic information of all the symbols.

As stated above, turbo codes encoded at the transmitter are frequently punctured and then transferred in consideration of the band efficiency in the digital communication systems, such as puncturing a code having code rate R=⅓ to R=½, and so on. That is, symbols encoded at a transmitter like $(X_1, Y_{11}, X_2, Y_{22}, X_3, Y_{13}, X_4, Y_{24}, \ldots, X_{N-1}, Y_{1N-1}, X_N, Y_{2N})$ are received at a receiver like $(x_1, y_{11}, x_2, y_{22}, x_3, y_{13}, x_4, y_{24}, \ldots, x_{N-1}, y_{1N-1}, x_N, y_{2N})$. These received symbols are formatted to $R_k$ to be inputted to a serial-concatenated decoder, and the received symbols inputted to the first decoder Dec1 become $R_1=(x_1, y_{11})$, $R_2=(x_2, 0)$, $R_3=(x_3, y_{13})$, $R_4=(x_4, 0)$, ..., $R_n=(X_n, 0)$, so an extrinsic information for each information bit is obtained, and the received symbols inputted to the second decoder Dec2 (under an assumption that the interleaving is ignored) become $R_1=(x_1, 0)$, $R_2=(x_2, y_{22})$, $R_3=(x_3, 0)$, $R_4=(x_4, y_{24})$, ..., $R_n=(X_n, y_{2n})$, so the extrinsic information for each information bit get improved. Here, punctured parity symbols are substituted by 0 since no information exists at the receiver, which hinders the improvement of the extrinsic information and requires more iterations to reach a desired performance (a bit error ratio(BER) at a given $E_b/N_0$).

That is, in case of performing the decoding by using the conventional turbo decoder as stated above, since the punctured portions are not known to the receiver, the receiver simply substitutes 0 for them and then performs the turbo encoding. Accordingly, there exists a problem in that the turbo decoder should execute many iterations to obtain a desired decoding performance.

SUMMARY OF THE INVENTION

The present invention has been devised to solve the above problem, so it is an object of the present invention to provide a pre-decoder for a turbo decoder capable of enhancing the decoding performance of the turbo decoder by recovering, before decoding the punctured turbo codes, the punctured portions of the received turbo codes and a method for recovering the punctured turbo codes.

In order to achieve the above object, the present invention provides a pre-decoder for a turbo decoder for decoding a turbo code consisting of a data symbol stream and a plurality of parity symbol streams parts of which are punctured, comprising an arithmetic unit for carrying out a same algorithm with respect to a binary-coded data bit stream that a turbo encoder performs for generating parity bit streams, the arithmetic unit for generating an estimation value of the parity bit streams; a comparison unit for comparing non-punctured bits of the parity bit streams with the estimation value calculated by the arithmetic unit; a modulation unit for modulating the estimation value of the parity bit streams outputted by the calculation unit to the parity symbol streams; and a recovery unit for recovering punctured parts of the parity symbol streams by substituting the punctured parts of the parity symbol streams for values of symbols of the estimation values corresponding to the punctured parts, when the respective non-punctured bits of the parity bit streams are identical with the bits of the estimation values according to a comparison result of the comparison unit.

In the case that different bits exist as the comparison result of the comparison unit, the recovery unit assigns a certain value, for example, "0", to the punctured symbols inputted after a symbol corresponding to the different bits.

Since the punctured parity symbols can be recovered completely, or at least partially, the decoding performance of the turbo decoder is improved and the number of iteration of the turbo decoder of the MAP method can be reduced. Accordingly, exact and rapid decoding operations can be carried out.

In the meantime, according to the present invention, a method for recovering a turbo code consisting of a data symbol stream and a plurality of parity symbol streams parts of which are punctured, is provided. The method comprises the steps of extracting the data symbol stream and the plurality of parity symbol streams from a received turbo code; calculating an estimation value of parity bit streams by carrying out an algorithm with respect to data bit stream corresponding to the data symbol stream, the algorithm being used by a turbo encoder for producing the parity bit streams corresponding to the parity symbol stream; comparing the parity bit streams corresponding to the parity symbol streams with the estimation value; modulating the calculated estimation value to the parity symbol streams; and substituting the punctured parts of the parity symbol streams for a value of a symbol of the estimation values corresponding to the punctured parts, when the respective bits of the parity bit streams are identical with the bits of the estimation values according to a comparison result of the comparison step.

BRIEF DESCRIPTION OF THE DRAWINGS

The above object and other advantages of the present invention will become more apparent by describing in detail a preferred embodiment thereof with reference to the attached drawings, in which.

DETAILED DESCRIPTION OF THE PREFERRED EMBODIMENT

Hereinafter, the present invention will be described in detail with reference to the accompanying drawings.

Figure 3:
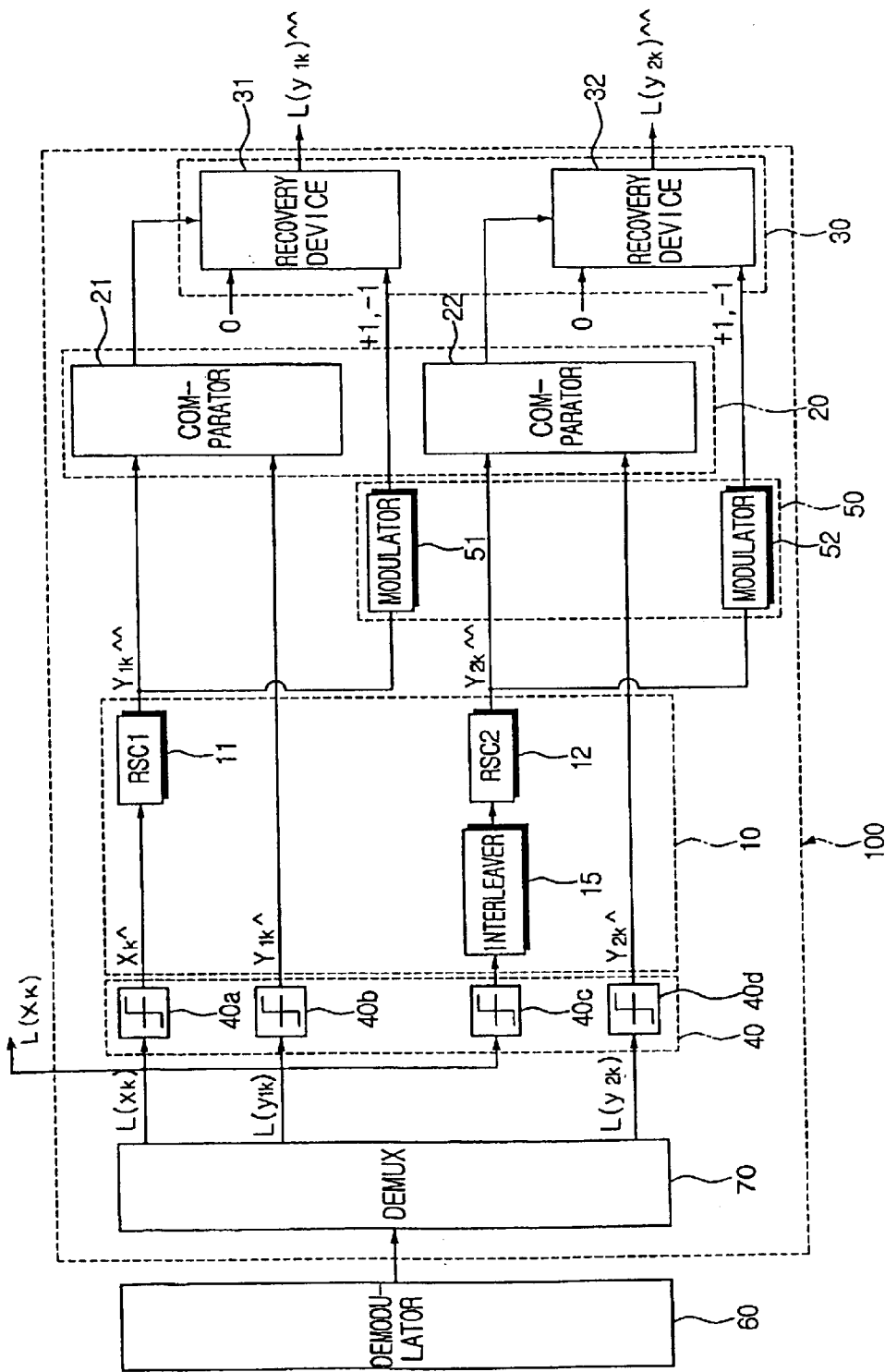
FIG. 3 is a block diagram illustrating a pre-decoder for turbo codes according to an embodiment of the present invention.

FIG. 3 is a block diagram for showing a pre-decoder for turbo codes according to an embodiment of the present invention. In the present embodiment, as illustrated in the description of the related art, an example is made as to a case where a turbo code at the code rate $R=1/3$ is punctured to a turbo code at the code rate $R=1/2$, and, in particular, an example will be made to cases where each bit of two parity bit streams are alternately punctured, such as a case where a turbo code of $(X_1, Y_{11}, Y_{21}, X_2, Y_{12}, Y_{22}, X_3, Y_{13}, Y_{23}, \ldots)$ is punctured like $(X_1, Y_{11}, X_2, Y_{22}, \ldots, X_{N-1}, Y_{1N-1}, X_N, Y_{2N})$. Here, the delay between the first parity symbol stream and the second parity symbol stream is ignored.

A pre-decoder 100 includes a binary-coding unit 40 for binary-coding a data bit stream and respective parity symbol stream of a received turbo code, an arithmetic unit 10 for computing an estimation value of the parity bit streams as stated later, a comparison unit 20 for comparing the estimation value with the parity bit stream, a modulation unit 50 for outputting the parity symbol streams by modulating the output of the arithmetic unit 10, and a recovery unit 30 for recovering punctured parts of the parity symbol streams based on a comparison result of the comparison unit 20. The pre-decoder 100 receives through a demultiplexer (DEMUX) 70 a signal transferred from a demodulator 60, and an output of the pre-decoder 100 is input to a turbo decoder as described later. The demultiplexer 70 separates the signal received from the demodulator 60 into a data symbol stream $x_k$ and parity symbol streams ($y_{1k}$, $y_k$), and the separated data symbol stream $x_k$ and the parity symbol streams($y_{1k}$, $y_{2k}$) are inputted into the binary-coded unit 40 of the pre-decoder 100.

The binary-coding unit 40 is constituted with four hard limiters 40a to 40d. The data symbol stream $x_k$ is inputted into the first and third hard limiters 40a and 40c, a first parity symbol stream $y_{1k}$ is inputted into the second hard limiter 40b, and a second parity symbol stream $y_{2k}$ is inputted to the fourth hard limiter 40d. Each of the hard limiters 40a to 40d binary-codes soft-values of the inputted symbol streams into +1 or 0, so as to generate the data bit stream $X_k\hat{}$ corresponding to the data symbol stream $x_k$ and the parity bit streams $Y_{1k}\hat{}$ and $Y_{2k}\hat{}$ corresponding to the parity symbol streams $Y_{1k}$ and $Y_{2k}$.

The arithmetic unit 10 consists of two recursive systematic convolutional blocks 11 and 12 and one interleaver 15. The respective RSC blocks 11 and 12, as described in the related art of FIG. 1, have the same functions as the RSC blocks RSC1 and RSC2 of the turbo encoder. Further, even the interleaver 15 has the same function as the interleaver in the turbo encoder described in the related art of FIG. 1. Accordingly, the arithmetic unit 10 executes the same algorithm with respect to the data bit stream $X_k\hat{}$ as that of generating the parity bit streams ($Y_{1k}$, $Y_{2k}$) in encoding a turbo code with respect to the data bit stream $x_k$.

The comparison unit 20 consists of two comparators 21 and 22. Outputs of the respective RSC blocks 11 and 12 and outputs of the second and fourth hard limiters 40b and 40d are input to the first and second comparators 21 and 22. Each of the comparators 21 and 22 judges whether inputted signals are identical to each other, and the judgement results are inputted to the recovery unit 30.

The modulation unit 50 consists of two modulators 51 and 52. The estimation value $Y_{1k}\hat{}\hat{}$ of the parity streams output from the first RSC block 11 is input to the first modulator 51, and the estimation value $Y_{2k}\hat{}\hat{}$ of the parity bit streams output from the second RSC block 12 is input to the second modulator 52. Each of the modulators 51 and 52 modulates the input estimation value $Y_{1k}\hat{}\hat{}$ and $Y_{2k}\hat{}\hat{}$ to the parity symbol streams.

The recovery unit 30 consists of two recovery devices 31 and 32. the outputs (−1 or +1) of the respective modulators 51 and 52 and "0" are input to the respective recovery devices 31 and 32. In case that the comparators 21 and 22 determine that the signals are not identical with each other, the recovery units 31 and 32 output "0", while, in case that the comparators 21 and 22 determine the signals are identical with each other, the recovery devices 31 and 32 output the outputs of the modulators 51 and 52 input thereto.

Figure 2:
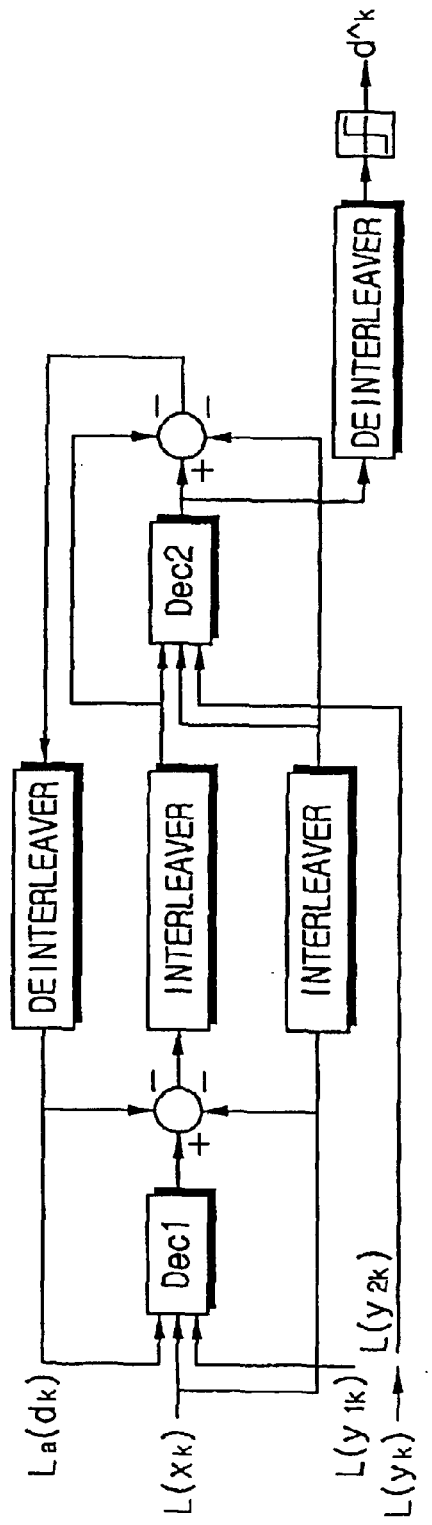
FIG. 2 is a block diagram illustrating a conventional turbo decoder.
Figure 4:
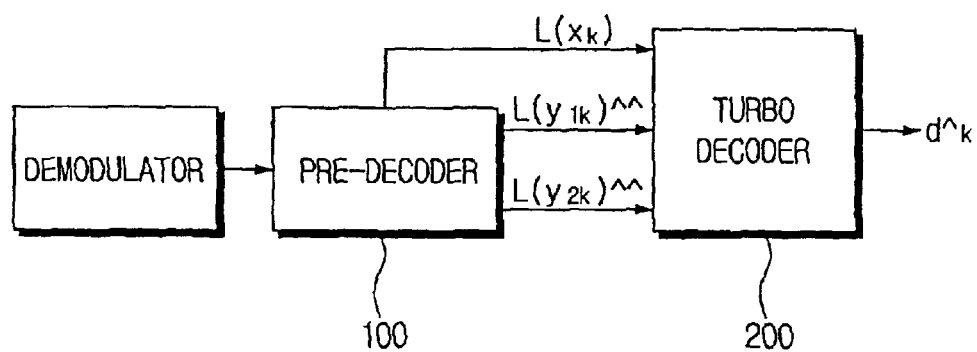
FIG. 4 is a block diagram illustrating an example in which the pre-decoder of FIG. 3 is applied to a turbo decoder.
Figure 5:
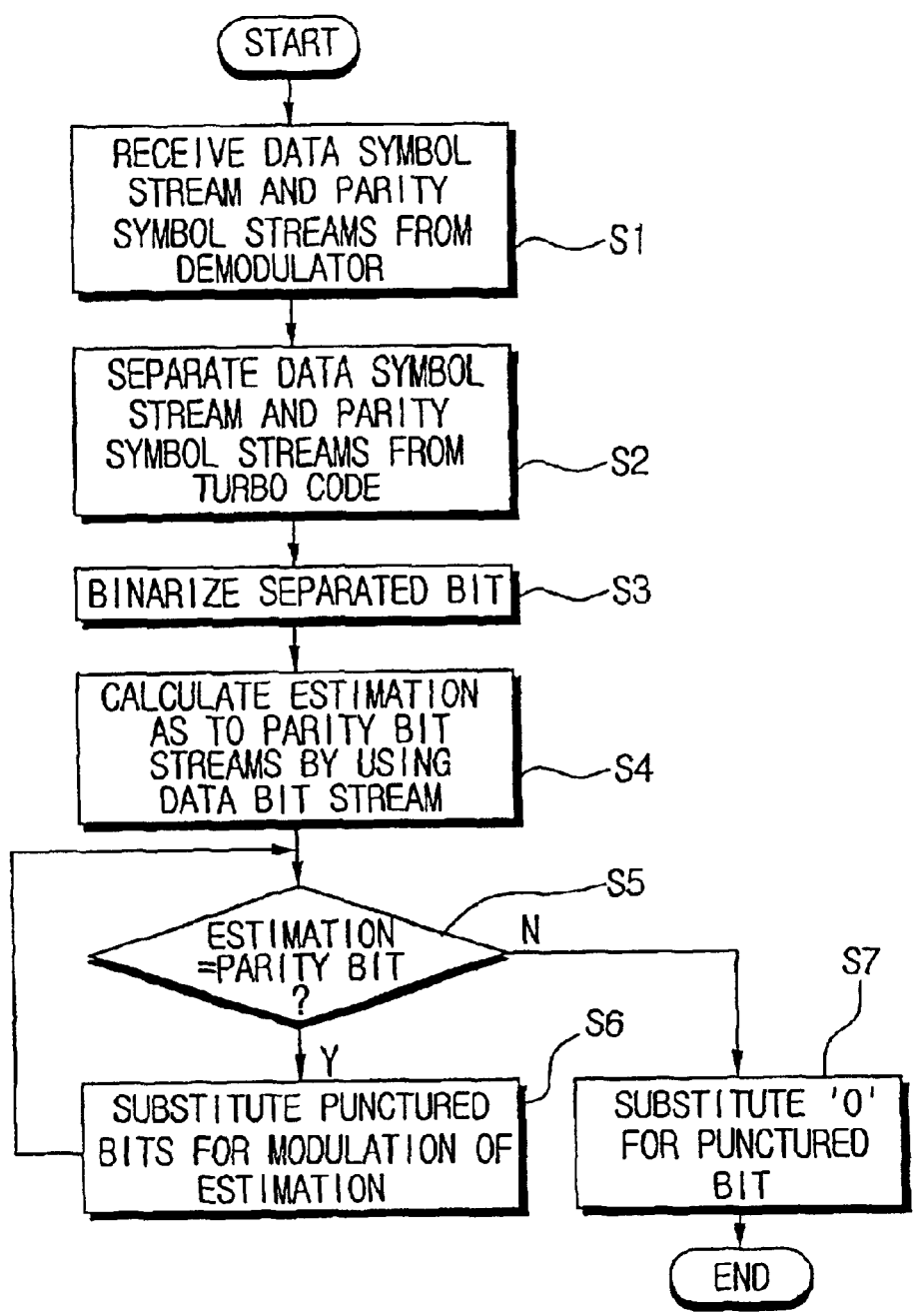
FIG. 5 is a flow chart illustrating a method for recovering punctured turbo codes according to an embodiment of the present invention.

FIG. 4 is a view for showing a state that the pre-decoder 100 according to the present invention is connected to a turbo decoder 200. The data symbol stream $L(x_k)$ out of the bit streams that the demultiplexer 70 outputs, and the outputs $L(y_{1k}\hat{}\hat{})$ and $L(y_{2k}\hat{}\hat{})$ of the respective recovery devices 31 and 32 in the pre-decoder 100, are inputted to the turbo decoder 200. The structure of the turbo decoder 200 are the same as the conventional turbo decoder 100 which has been described with reference to FIG. 2. Accordingly, the turbo decoder 200 decodes a turbo code of the code rate $R=1/3$ by the iteration operations as stated above and then extracts an information bit stream $d\hat{}_k$.

A process for recovering a punctured turbo code of the pre-decoder for a turbo decoder according to the present invention is described below.

First, the demultiplexer 70 receives the data symbol stream and parity symbol streams to which channel reliability is multiplied, from the demodulator 60 (step S1), and separates a data symbol stream $L(x_k)$ and first and second parity symbol streams $L(y_{1k})$ and $L(y_{2k})$ from the received turbo code, respectively (step S2). The binary-coding unit 40 in the pre-decoder 100 binary-codes the data symbol stream $L(x_k)$ and the parity symbol streams $L(y_{1k})$ and $L(y_{2k})$ into a +1 or 0 value according to their magnitudes. According to this, the data symbol stream $L(x_k)$ and the parity symbol streams $L(y_{1k})$ and $L(y_{2k})$ are changed to binary-coded data bit stream $X_k\hat{}$ and parity bit streams $Y_{1k}\hat{}$ and $Y_{2k}\hat{}$ (step S3).

Figure 1:
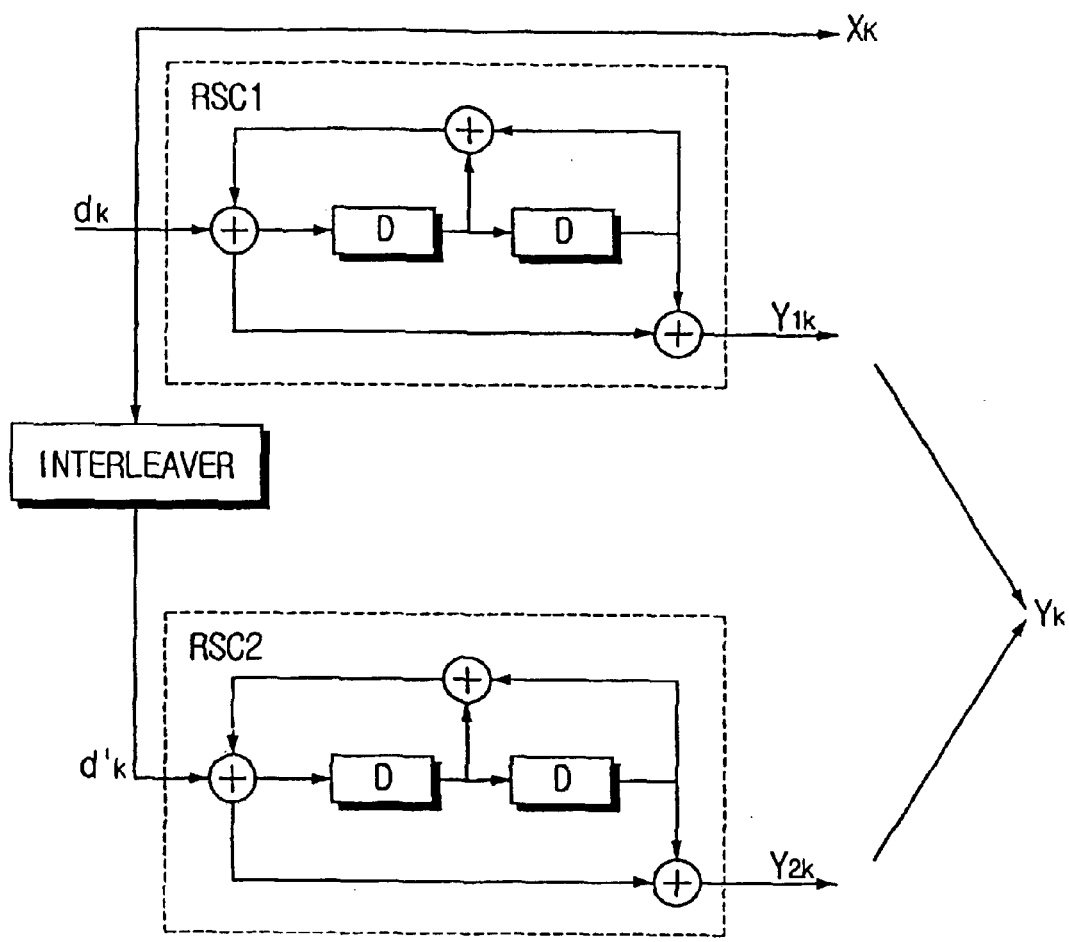
FIG. 1 is a block diagram illustrating a conventional MAP turbo encoder.

The binary-coded value outputted from the first hard limiter 40a is input to the first RSC block 11, and the first RSC block 11, as described in the conventional art of FIG. 1, carries out the same algorithm that produced the first parity bit stream $Y_{1k}$ when encoding the turbo code. By carrying out the algorithm with respect to the data bit stream $X_k$ of the received turbo code, the first RSC block 11 calculates an estimation value $Y_{1k}\hat{}$, namely, ($Y_{11}\hat{}\hat{}$, $Y_{12}\hat{}\hat{}$, $Y_{13}\hat{}\hat{}$, ...), of ($Y_{11}$, $Y_{12}$, $Y_{13}$, ...) which is the parity bit stream $Y_{1k}$ transferred from the transmitter of the turbo code(step S4).

The binary-coded value outputted from the third hard limiter 40c is input to the interleaver 15, interleaved therein, and then input to the second RSC block 12. Accordingly, the interleaver 15 and the second RSC block 12 perform the same algorithm that produced the second parity bit stream $Y_{2k}$ when encoding the turbo code, as described in the related art of FIG. 1. By carrying out the algorithm with respect to the data bit stream $x_k$ of the received turbo code, the second RSC block 12 calculates an estimation value $Y_{2k}^{\wedge\wedge}$, namely, $(Y_{21}^{\wedge\wedge}, Y_{22}^{\wedge\wedge}, Y_{23}^{\wedge\wedge}, \ldots)$, of $(Y_{21}^{\wedge}, Y_{22}^{\wedge}, Y_{23}^{\wedge}, \ldots)$ which is the second bit stream $Y_{2k}$ transferred from the transmitter of the turbo code (step S4). The first and second modulator 51 and 52 modulate the estimation values $Y1k^{\wedge\wedge}$ and $Y2k^{\wedge\wedge}$ to the parity symbol streams of which value is +1 or −1.

The first comparator 21 compares the estimation value $Y_{1k}^{\wedge\wedge}$ of the first parity bit stream calculated by the first RSC block 11 with the first parity bit stream $Y_{1k}$ outputted from the second hard limiter 40b (step S5). Since the first parity bit stream $Y_{1k}^{\wedge}$ has even-numbered bits punctured, the bit stream becomes like $(Y_{11}^{\wedge}, 0, Y_{13}^{\wedge}, 0, Y_{15}^{\wedge}0, \ldots)$ and an estimation value becomes like $(Y_{11}^{\wedge\wedge}, Y_{12}^{\wedge\wedge}, Y_{13}^{\wedge\wedge}, Y_{14}^{\wedge\wedge}, \ldots)$. The first comparator 21 sequentially compares the bits corresponding to non-punctured bits and then outputs the comparison results. That is, $Y_{11}^{\wedge}$ is compared to $Y_{11}^{\wedge\wedge}$, and $Y_{13}^{\wedge}$ is compared to $Y_{13}^{\wedge\wedge}$. In the same way, the second comparator 22 compares the non-punctured bits of the second parity bit stream $Y_{2k}^{\wedge}$ with the estimation value $Y_{2k}^{\wedge\wedge}$ and then outputs the comparison results.

The first recovery device 31 outputs "0" or a value input from the first modulator 51 according to the comparison result of the first comparator 21. That is, while the first parity bit stream $Y_{1k}^{\wedge}$ and the estimation value $Y_{1k}^{\wedge\wedge}$ are determined to be identical with each other according to the comparison result, the modulated value of the estimation value $Y_{1k}^{\wedge\wedge}$ is outputted to the punctured bit. Then after different bits are found, the values of punctured bits are outputted as "0". Such a process continues while one frame of the turbo code is received, and, if a next frame starts to be received after the reception of one frame is completed, the process is repeated, so that the recovery device 31 outputs the modulated value of the estimation value $Y_{1k}^{\wedge\wedge}$ or "0" according to the comparison result of the comparator 21. Accordingly, as long as the non-punctured bits of the first parity bit stream $Y_{1k}^{\wedge}$ are determined to be identical with the estimation value $Y_{1k}^{\wedge\wedge}$ according to the comparison result, the punctured bits of the first parity symbol stream $L(y_{1k})$ are substituted by the modulated value of the estimation value $Y_{1k}^{\wedge\wedge}$ (step S6). It not, the punctured bits are substituted by "0" thereafter (step S7).

According to the comparison result of the comparator 21, when the parity bit stream $Y_{1k}^{\wedge}$ is determined to be identical with the estimation value $Y_{1k}^{\wedge\wedge}$, since it can be estimated that the value of the received data bit stream $x_k$ is identical with the value of the transferred data bit stream $X_k$, the punctured bits of the parity symbol stream $L(y_{1k})$ can be recovered through the above process. However, when the parity bit stream $Y_{1k}^{\wedge}$ is determined to be different from the estimation value $Y_{1k}^{\wedge\wedge}$ according to the comparison result of the comparator 21, the recovery process of the punctured bits of the parity symbol stream $L(y_{1k})$ stops, and the value is considered as "0" as in the usual cases. Accordingly, in case that the value of the received data bit stream $x_k$ is of possibility to be different from the value of the transferred data symbol stream $X_k$, the recovery process stops. Therefore, the punctured bit stream is recovered completely, or at least partially.

The operations of the second recovery device 32 are the same as above. According to this, part or all of the punctured symbols of the second parity symbol stream $L(y_{2k})$ become recovered based on the estimation value $Y_{2k}^{\wedge\wedge}$ by the second recovery device 32.

With the punctured symbol stream recovered, the turbo code of the code rate $R=\frac{1}{3}$, that is, the turbo code consisting of one data symbol stream $L(x_k)$ and two parity symbol streams $L(y_{1k}^{\wedge\wedge})$ and $L(y_{2k}^{\wedge\wedge})$, is inputted to the turbo decoder 200 as shown in FIG. 4 and then decoded by the turbo decoder 200, so that the information bit $d_k^{\wedge}$ is extracted.

In the above embodiment, even though the pre-decoder 100 and method for recovering punctured turbo codes, which are applied to the case that the turbo code of the code rate $R=\frac{1}{3}$ is punctured in a turbo code of $R=\frac{1}{2}$, have been described, the application can be made to a case that a turbo code of smaller code rate, for example, $R=\frac{1}{4}$ or $R=\frac{1}{5}$, is punctured. In the above examples, plural RSC blocks and interleavers which have the same structure as that of a turbo encoder for producing the parity bit streams are required in order to calculate estimation values of parity bit streams. However, the principles are realized in the same way as stated above.

Further, in the above embodiment, even though the example in which respective parity bit streams are alternately punctured, that is, the example in which the turbo code of $(X_1, Y_{11}, Y_{21}, X_2, Y_{12}, Y_{22}, X_3, Y_{13}, Y_{23})$ is punctured like $(X_1, Y_{11}, X_2, Y_{22}, \ldots, X_{N-1}, Y_{1N-1}, X_N, Y_{2N})$ and received like $(x_1, y_{11}, x_2, y_{22}, \ldots, x_{N-1}, y_{1N-1}, x_N, y_{2N})$ at the receiver has been described, the present invention can be applied to cases different in the puncturing method. However, in order for the comparison unit 20 to compare only the non-punctured portions with their estimation values, the puncturing fashion of the turbo code is known beforehand, and the fashion should be reflected on the operations of the comparison unit 20.

According to the present invention, part or all of the punctured symbols can be recovered by using a pre-decoder before decoding a turbo code in order to enhance the band efficiency upon transmissions through channels. Therefore, the decoding performance of the turbo decoder is improved and the number of iteration of the turbo decoder of the MAP method is reduced, so that exact and rapid decoding operations can be carried out.

Although the preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A pre-decoder for a turbo decoder for decoding a turbo code consisting of a data symbol stream and a plurality of parity symbol streams, parts of which are punctured, the pre-decoder comprising:

an arithmetic unit for carrying out, with respect to a binary-converted data bit stream, the same algorithm that a turbo encoder performs for generating parity bit streams, and generating estimated parity bit streams;

a comparison unit for comparing non-punctured bits of binary-converted parity bit streams with the estimated parity bit streams generated by the arithmetic unit;

a modulation unit for modulating the estimated parity bit streams into estimated parity symbol streams; and a recovery unit for recovering punctured parts of the parity symbol streams by substituting symbols of the estimated parity symbol streams for corresponding punctured parts of the parity symbol streams, when related non-punctured bits of the binary-converted parity bit streams are identical with corresponding bits of the estimated parity bit streams, according to comparison result results of the comparison unit.

2. The pre-decoder as claimed in claim 1, wherein, if a comparison result by the comparison unit indicates disagreement, the recovery unit assigns a predetermined value to a symbol of the punctured parts.

3. The pre-decoder as claimed in claim 1, wherein the arithmetic unit includes a plurality of recursive systematic convolutional (RSC) blocks corresponding to the number of the parity symbol streams, and at least one interleaver for interleaving the binary-converted data bit stream and providing the interleaved binary-converted data bit stream to at least one of the RSC blocks.

4. The pre-decoder as claimed in claim 1, further comprising a binary-converter unit for generating the binary-converted data bit stream and the binary-converted parity bit streams by binary converting the data symbol stream and the parity symbol streams, and providing the binary-converted data bit stream and the binary-converted parity bit streams to the arithmetic unit and the comparison unit, respectively.

5. The pre-decoder as claimed in claim 4, further comprising a demultiplexer for separating the turbo code output from a demodulator into the data symbol stream and the parity symbol streams and providing the data symbol stream and the parity symbol streams to the binary converter unit.

6. A method for recovering a turbo code consisting of a data symbol stream and a plurality of parity symbol streams, parts of which are punctured, the method comprising the steps of:

extracting a data symbol stream and a plurality of parity symbol streams from a received turbo code;

calculating estimated parity bit streams by carrying out, with respect to a binary-converted data bit stream corresponding to the extracted data symbol stream, the same algorithm used by a turbo encoder for producing the parity bit streams corresponding to the extracted parity symbol streams;

comparing binary-converted parity symbol streams corresponding to the parity symbol streams with the estimated parity bit streams;

modulating the estimated parity bit streams into estimated parity symbol streams; and substituting symbols of the estimated parity symbol streams for corresponding punctured parts of the parity symbol streams, when related bits of the binary-converted parity bit streams are identical with corresponding bits of the estimated parity bit streams according to comparison results of the comparison step.

7. The method as claimed in claim 6, further comprising a step of, responsive to the comparison result of non-equality in the comparison step, assigning a predetermined value to a symbol of the punctured symbols.

* * * * *